(12) United States Patent
Goren et al.

(10) Patent No.: US 8,453,078 B2
(45) Date of Patent: May 28, 2013

(54) INTEGRATED CIRCUIT TRANSFORMER DEVICES FOR ON-CHIP MILLIMETER-WAVE APPLICATIONS

(75) Inventors: David Goren, Haifa (IL); Ullrich R. Pfeiffer, Yorktown Heights, NY (US); Benny Sheinman, Haifa (IL); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/292,585

(22) Filed: Nov. 9, 2011

(65) Prior Publication Data

US 2012/0060135 A1 Mar. 8, 2012

Related U.S. Application Data

(62) Division of application No. 12/106,531, filed on Apr. 21, 2008, now Pat. No. 8,122,393.

(51) Int. Cl.
*G06F 17/50* (2006.01)

(52) U.S. Cl.
USPC .............. 716/101; 716/126; 716/139; 703/14

(58) Field of Classification Search
USPC ......................................... 716/101, 126, 139
See application file for complete search history.

(56) References Cited

U.S. PATENT DOCUMENTS 7,003,744 B2 * 2/2006 Weller et al. ................. 716/103

* cited by examiner

*Primary Examiner* — Thuan Do
(74) *Attorney, Agent, or Firm* — F. Chau & Associates, LLC; Anne V. Dougherty, Esq.

(57) ABSTRACT

Methods are provided for building integrated circuit transformer devices having compact and optimized architectures for use in MMW (millimeter-wave) applications. The integrated circuit transformer devices have universal and scalable architectures that can be used as templates or building blocks for constructing various types of on-chip devices for millimeter-wave applications.

8 Claims, 7 Drawing Sheets

INTEGRATED CIRCUIT TRANSFORMER DEVICES FOR ON-CHIP MILLIMETER-WAVE APPLICATIONS

CROSS-REFERENCE TO RELATED APPLICATION

This is a Divisional Application of U.S. application Ser. No. 12/106,531 filed on Apr. 21, 2008, which is a Divisional Application of U.S. Pat. No. 7,427,801 filed on Apr. 8, 2005, the disclosures of which are herein incorporated by reference in their entirety.

TECHNICAL FIELD

The present invention relates generally to integrated circuit transformer devices having compact and optimized architectures for use in MMW (millimeter-wave) applications. More specifically, the invention relates to integrated circuit transformer devices having universal and scalable architectures that can be used as templates or building blocks for constructing various types of on-chip devices for millimeter-wave applications.

BACKGROUND

In general, a transformer is a device that comprises a core (e.g., magnetic), a primary coil and one or more secondary coils. The primary coil receives electrical energy from a power source and couples the energy to the secondary coil(s) by virtue of changing magnetic field, wherein the energy appears as an electromagnetic field across the coil. If a load is connected to the secondary coil, the energy is transferred to the load. The output power of the transformer cannot exceed the input power to the transformer, so the output current is reduced in direct proportion to the gain in voltage (and vice versa).

RF (radio frequency) transformers are commonly used in electronic circuits for applications such as impedance matching (for maximum power transfer), AC voltage step-up/step-down, DC isolation between two circuits, common mode rejection, filters, etc. In addition, a transformer can be used to construct a BALUN having, e.g., a balanced input, where both input ports are isolated from ground to an unbalanced output where one output port is connected to ground.

Figure 1:
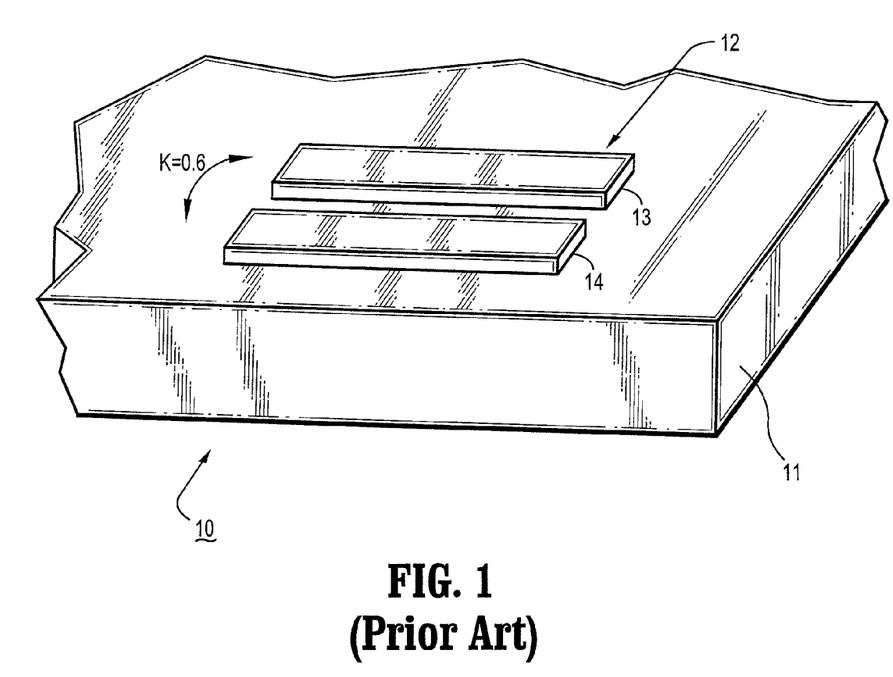
FIG. 1 schematically illustrates a conventional integrated circuit transformer device.

For on-chip applications, transformers are typically constructed using coupled wires. A simple transformer structure comprises two wires with the same windings on each side, which is referred to as a 1:1 transformer or simply coupled-wires. By way of example, FIG. 1 is a perspective view of a semiconductor device having a conventional integrated transformer device. In FIG. 1, the semiconductor device (10) comprises a substrate (11) having integrated coplanar transformer (12) formed on a surface thereof. The transformer (12) comprises a first conductor (13) (primary) and a second conductor (14) (secondary) that are disposed parallel on the same layer. The conductors are patterned from a metal layer that is formed on the substrate surface, and then encapsulated in a dielectric or insulating layer.

Transformer devices such as depicted in FIG. 1 typically have poor electrical performance (e.g., low coupling, k=0.06) and exhibit high loss, especially when implemented for high frequency applications. Indeed, for lossy substrates such as silicon, the capacitive coupling between the metal lines (13), (14) and substrate (11) can result in increased power dissipation. If the metal lines are reduced in width to limit such capacitive coupling, the resistance of the metal line increases (e.g., via skin effect) resulting in increased power dissipation. Moreover, conventional transformer designs such as in FIG. 1 do not have well-defined return paths for closed environment EM conditions, which results in the electrical performance being more sensitive to surrounding metallic components. According, integrated circuit coplanar transformer devices such as depicted in FIG. 1 are typically used at lower frequencies where lower coupling factors, losses due to the skin effect, and inaccuracies caused by model to hardware discrepancies can be tolerated.

BRIEF SUMMARY

In general, exemplary embodiments of the invention include integrated circuit transformer devices having compact and optimized architectures for use in MMW (millimeter-wave) applications. More specifically, exemplary embodiments of the invention include integrated circuit transformer devices having universal and scalable architectures that can be used as templates or building blocks for constructing various types of on-chip devices for millimeter-wave applications, including, for example, power combiners, baluns, distributed active transformers, and filters.

In one exemplary embodiment, an integrated circuit transformer includes a substrate, a ground shield formed on the substrate, a primary conductor comprising an elongated conductive strip, and a secondary conductor comprising an elongated conductive strip. The primary and secondary conductors are aligned to form a coupled-wire structure that is disposed adjacent to the ground shield. Moreover, the ground shield comprises a pattern of close-ended parallel elongated slots that are disposed orthogonal to the primary and secondary conductors, as well as edge regions that provide current return paths that are collinear to the primary and secondary conductors.

In one exemplary embodiment of the invention, the ground shield, the primary conductor and the secondary conductor are disposed on different layers of an integrated circuit and aligned to form a stacked structure. A first insulation layer is disposed between the ground shield and secondary conductor, and a second insulation layer is disposed between the secondary conductor and the primary conductor. In one embodiment, the ground shield, and primary and secondary conductors are formed from different BEOL (back end of line) metallization layers.

An exemplary 1:1 integrated circuit transformer structure, which has a ground shield design with orthogonal close-ended slots and edge regions that provide current return paths collinear to the primary and secondary conductors, can be accurately modeled using 3D/2D compact modeling to build 1:1 transformer template models that are scalable by length. More specifically, the exemplary ground shield structure provides closed-environment EM conditions which relaxes the parasitic effects and boundary conditions, thereby allowing compact models of 1:1 integrated circuit transformer templates to be defined which are scalable by length independent of the proximity of other structures in the layout.

Accordingly, an exemplary 1:1 integrated circuit transformer template device can be accurately modeled using a lumped equivalent element model (e.g., RLC network) which is scalable by conductor length, Lc, (and other possible geometric parameters). The lumped equivalent element model of an exemplary 1:1 integrated circuit transformer template device can be used in circuit simulation applications to obtain accurate simulations of circuits having such 1:1 integrated circuit transformer templates, irrespective of the circuit layout.

These and other exemplary embodiments, features and advantages of the present invention will be described or become apparent from the following detailed description of exemplary embodiments, which is to be read in connection with the accompanying drawings.

DETAILED DESCRIPTION

Figure 2A:
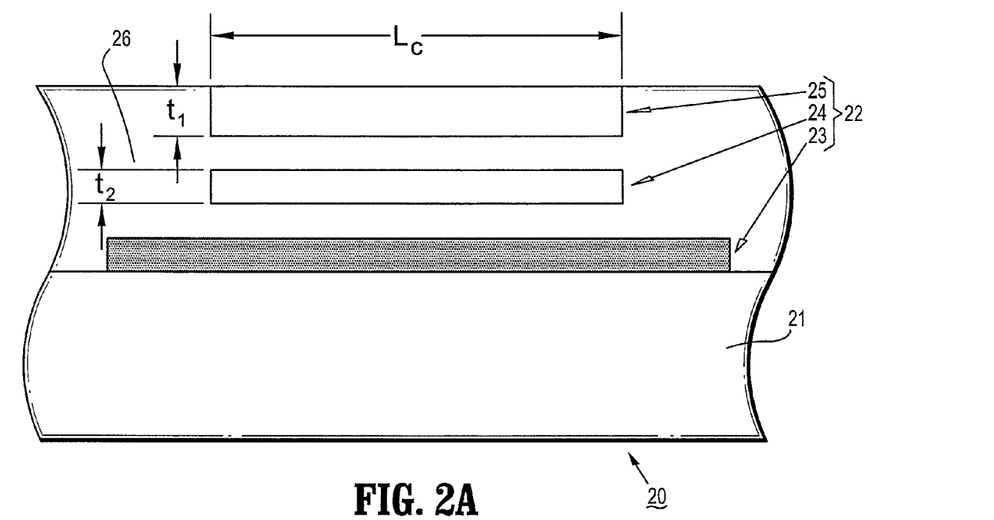
FIGS. 2A and 2B schematically illustrate an integrated circuit transformer device according to an exemplary embodiment of the invention.
Figure 2B:
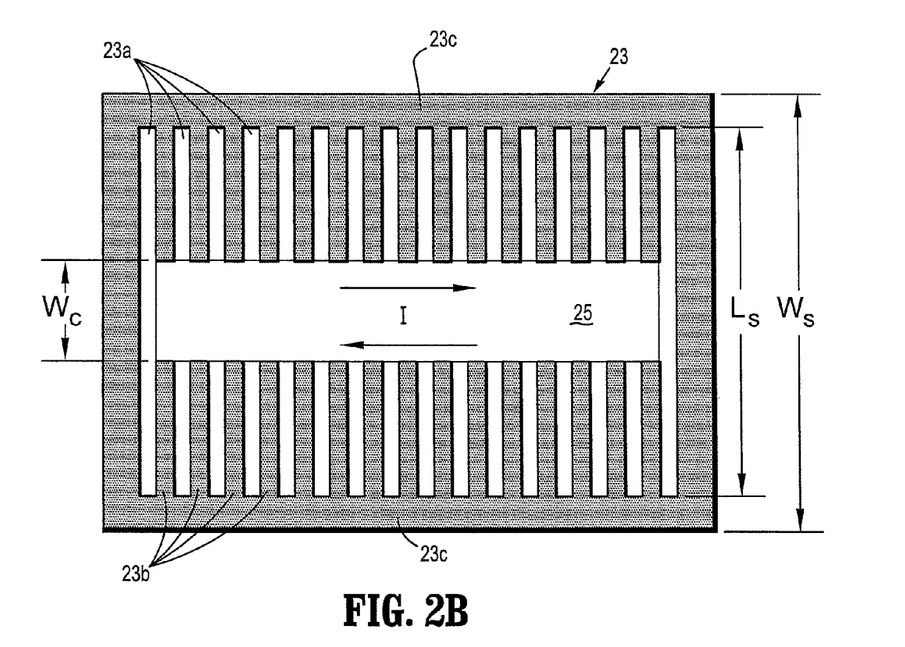

FIGS. 2A and 2B are diagrams that schematically illustrate an integrated transformer device according to an exemplary embodiment of the invention. In particular, FIG. 2A is a schematic side-view of a semiconductor device (20) comprising a substrate (21) having an integrated transformer device (22) formed thereon, and FIG. 2B is a schematic top plan view of the exemplary device (20) of FIG. 2A. As depicted in FIGS. 2A and 2B, the transformer (22) comprises a ground element (23) (or ground shield), a secondary conductor (24) and a primary conductor (25), which are formed on separate layers of an integrated circuit formed on the substrate (21) to form a stacked transformer structure (22). The transformer (22) is encapsulated in an insulative/dielectric material (26) (e.g., silicon dioxide or other insulative or dielectric materials), wherein a thin layer of insulative/dielectric material is disposed between the ground element (23) and secondary conductor (24) and between the secondary conductor (24) and the primary conductor (25). The exemplary embodiment depicted in FIGS. 2A and 2B shows the primary and secondary conductors (24) and (25) as being stacked coupled-wires having equal lengths Lc and widths Wc. Moreover, the primary conductor (25) has thickness denoted $t_1$ and the secondary conductor has a thickness denoted $t_2$. As explained below, depending on the application, the primary conductor (25) can be formed thicker than the secondary conductor (24) to accommodate higher current densities (DC current).

FIG. 2B further illustrates a pattern for the ground shield element (23) according to an exemplary embodiment of the invention. The exemplary ground shield element (23) comprises a planar metal sheet that is patterned to form a series of parallel close-ended slots (23a) of length Ls. The formation of the close-ended slots (23a) results in the ground shield element (23) having a series of parallel conductive strips (23b) that are commonly connected at end portions thereof along edge regions (23c) (or "side-bar" elements) of the ground shield (23). The close-ended slots (23a) and conductive strips (23b) are disposed in relation to the primary and secondary conductors (24) and (25) such that the slots (23a) and strips (23b) are disposed orthogonal to the directions of wave propagation (as depicted by directional arrows for AC current, I) along the length (longitudinal direction) of the stacked secondary and primary conductors (24) and (25). The exemplary pattern of alternating slots (23a) and strips (23b) extends along the entire lengths Lc of the stacked coupled-wires (24) and (25). Moreover, the side regions (23c) (or side-bar elements) are designed to provide current return paths that extend collinear to the direction of wave propagation lengthwise along the lengths of the stacked conductors (24) and (25).

It is to be appreciated that that an integrated transformer device having stacked primary conductor, secondary conductor, and slotted ground shield framework, such as depicted in FIGS. 2A and 2B provides a compact 1:1 integrated circuit transformer structure that is highly efficient and provides high-coupling factors (e.g., k=0.8 or better) for use in millimeter waver applications. Indeed, a stacked coupled-wire framework (as compared to conventional coplanar structures of FIG. 1) confines the EM fields between the primary and secondary conductors, thereby yielding increased coupling between the primary and secondary conductors and lower losses due to less current crowding effect (less skin effect by width), as well as reduced frequency dependence which allows for higher bandwidth modeling.

Moreover, the slotted ground shield framework, which has a series of densely-spaced conductive strips (23b) and close-ended slots (23a) arranged orthogonal to wave propagation along the primary and secondary conductors, provides effective EM shielding from the substrate (e.g., silicon substrate) which significantly reduces substrate induced losses, and enhances the coupling factor, k, between the primary and secondary conductors. More specifically, the conductive strips (23b) provides means for preventing EM energy from flowing into the substrate (21). Furthermore, the use of close-ended slots (23a) arranged orthogonal to wave propagation along the stacked conductors (24) and (25) provides means for reducing the generation of image currents flowing in the ground shield the direction of wave propagation, thereby decreasing the coupling between the conductors (24) and (25) and the ground shield (23) and effectively enhancing the coupling factor between the primary and secondary conductors (24) and (25).

Furthermore, the edge regions (23c) (or side-bar elements) of the ground shield (23) provide well-defined current return paths (for closed environment EM conditions) that are collinear to wave propagation. In addition, the edge regions (23c) provide means for shielding/isolating the transformer structure from the effects of other components/elements (e.g., vias, amplifiers, wiring, grounds, etc.) surrounding or in proximity to the transformer.

In fact, as will be explained below, a slotted ground shield with side-bar elements enables highly compact modeling of the integrated circuit transformer structure to build a lumped equivalent model (e.g., RLC elements), which is scalable by length, Lc. The lumped equivalent model for an integrated transformed device enables circuit/network analysis of an integrated circuit having one or more of the transformer templates without requiring a full 3D simulation of the integrated circuit. In this regard, it is to be further appreciated that an integrated circuit 1:1 transformer device such as depicted in FIGS. 2A and 2B can be readily used as a template (or building block), which is parameterized by length, for constructing various integrated circuit devices and modular structures including, but not limited to, power amplifiers, n:1 impendence transformers, and power combiners. Exemplary embodiments of integrated circuit devices that implement 1:1 integrated transformer templates will be described below with reference to FIGS. 3-5, for example.

Furthermore, an IC transformer device such as depicted in FIGS. 2A and 2B can be used as a resonant tuning circuit to provide a high-efficiency resonating structure, e.g., using simple capacitances at both ends of the secondary conductor, or by designing the conductor length Lc equal to ½ wavelength for the fundamental operating frequency. The IC transformer structure provides a strong peak in current coupling, and enables increased voltage coupling as compared to coupling obtained due to tank resonance circuits. Moreover, the IC transformer structure provides a strong peak in power coupling and provides a real (rather than reactive) input impedance. Moreover, an integrated circuit transformer can be designed with a symmetrical framework to provide equal input and output impedances (e.g., designing parallel, evenly-spaced close-ended slots in ground shield).

It is to be appreciated that various semiconductor fabrication methods may be used for constructing an IC transformer device as depicted in FIGS. 2A and 2B. For high-frequency applications, the exemplary IC transformer device can be fabricated based on compound semiconductor technologies such as GaAs (gallium-arsenide) or SiGe (silicon germanium), or other technologies that are suitable for highly integrated circuits operating in millimeter-wave frequency ranges.

In one exemplary embodiment, an IC transformer device may be fabricated by forming the primary and secondary conductors and ground shield from different metallization layers that are deposited and processed using a BEOL (back-end-of-line) process. More specifically, in one exemplary embodiment, after forming active circuit regions on a substrate, an insulation layer (e.g., silicon dioxide (SiO2)) insulating layer and first metallization layer can be sequentially formed over the active regions. The ground shield (23) can be formed by patterning a portion of the first metallization layer. Following the first metallization, a second insulation layer and second metal layer are sequentially formed. The portion of the second metal layer that is aligned to the ground shield (23) is patterned to form the secondary conductor (24). Thereafter, a third insulation layer and third metallization layer are sequentially deposited, and the portion of the metal layer aligned to the secondary conductor (24) is patterned to form the primary conductor (25). In another exemplary embodiment of the invention, the above process can be reversed to form a stacked IC transformer with the ground shield disposed over the secondary and primary conductors. In such embodiments, it is preferable that the metal layer forming the primary conductor is of sufficient thickness to handle increased current densities, for certain applications such as described below.

In one specific exemplary embodiment, the stacked IC transformer can be formed using the current SiGe8HP semiconductor technology of International Business Machines Corporation, wherein the BEOL process includes five layers of metallization formed over the active chip surface. With such technology, the top three layers of metals can be utilized for the primary, second and ground shield elements, and the lower two layers are utilized to form connections between active components and form connections from active components to components of the transformer elements.

It is to be appreciated that the dimensions of an IC transformer device as depicted in FIGS. 2A and 2B will vary depending on the application and semiconductor processing technologies implemented. For instance, the slot length Ls should be of sufficient length to extend past the sides of the conductors (24) and (25) to prevent formation of longitudinal image currents on the ground shield due to coupling of the EM fields between the secondary and ground elements. Moreover, the width and spacing of the slots (23*a*) and strips (23*b*) should be sufficiently smaller than the operating wavelength to avoid formation of longitudinal image currents on the conductive strips (23*b*). Moreover, it is preferable to provide a dense pattern of conductive strips (23*b*) to minimize capacitive coupling between the substrate and secondary conductor. In practice, the slot/strip widths are limited by the design rules of the given fabrication process.

Moreover, the distances/separation between the primary and secondary conductors should be sufficiently smaller than the operating wavelength. Moreover, the conductor widths WC will be selected based on factors such as the operating frequency and resistivity of the material used to form the primary and secondary conductors, to thereby provide sufficient surface area to minimize resistive losses resulting from skin effect phenomenon. In one exemplary embodiment of the invention, the secondary conductor can be formed wider than the primary conductor to provide increase coupling of fringing fields from the primary conductor. The thickness t1 and t2 of the conductors will be determined based on the fabrication methods implemented, and/or can be selected to accommodate the current densities for the given application.

Figure 2C:
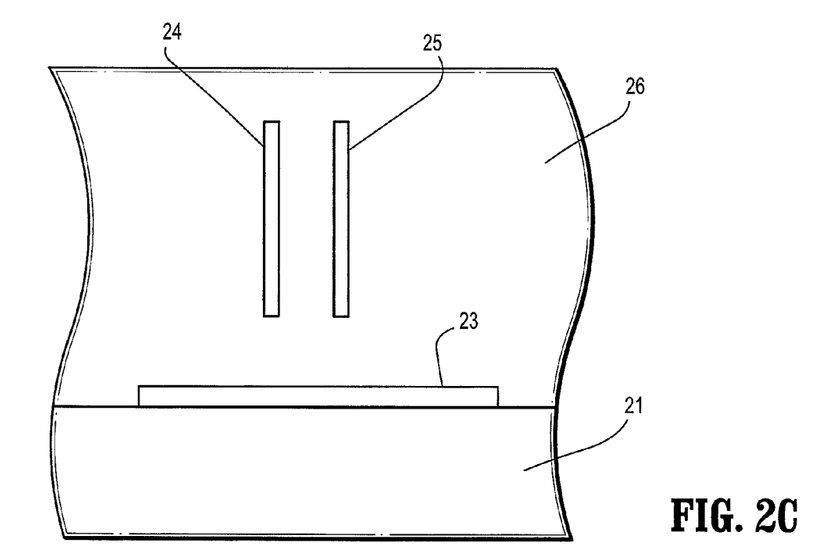
FIG. 2C schematically illustrates an integrated circuit transformer device according to another exemplary embodiment of the invention.

In other exemplary embodiments of the invention, coupled primary (25) and secondary (24) conductors can be stacked horizontally (disposed adjacent to each other) over the ground shield (23), such as depicted in FIG. 2C. In effect, the resulting structure can be viewed as the coplanar conductors (13) and (14) as depicted in FIG. 1, except that the conductors (24) and (25) in FIG. 2C are much thicker than wider. In this manner, increased coupling between the conductors (24) and (25) may be achieved, while forming the conductors (24) and (25) on the same layer of an integrated circuit.

Figure 2D:
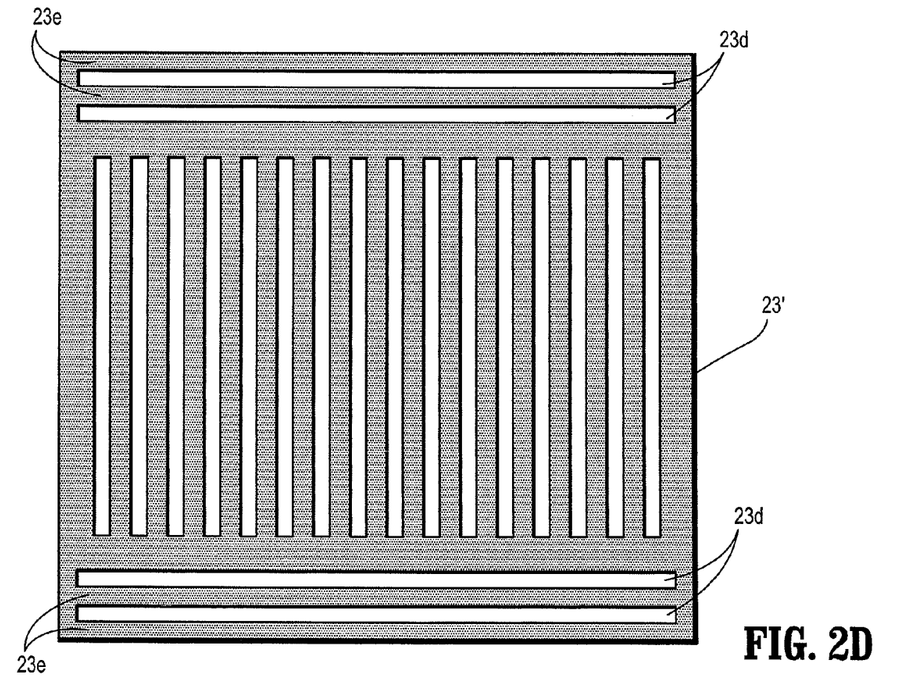
FIG. 2D schematically illustrates a ground shield pattern according to an exemplary embodiment of the invention.

In yet other exemplary embodiments of the invention, the edge regions of the ground shield can have longitudinal slots formed therein, wherein the slots are formed collinear to wave propagation. For instance, FIG. 2D is an exemplary ground shield 23' which is similar to the ground shield (23) of FIG. 2B, except that the side edge regions have longitudinal slots (23*d*) that form conductive strips (23*e*) which are connected to the ground shield structure. The slotted edge regions provide increased isolation from nearby objects and prevent coupling of eddy currents flowing on the substrate.

Figure 3:
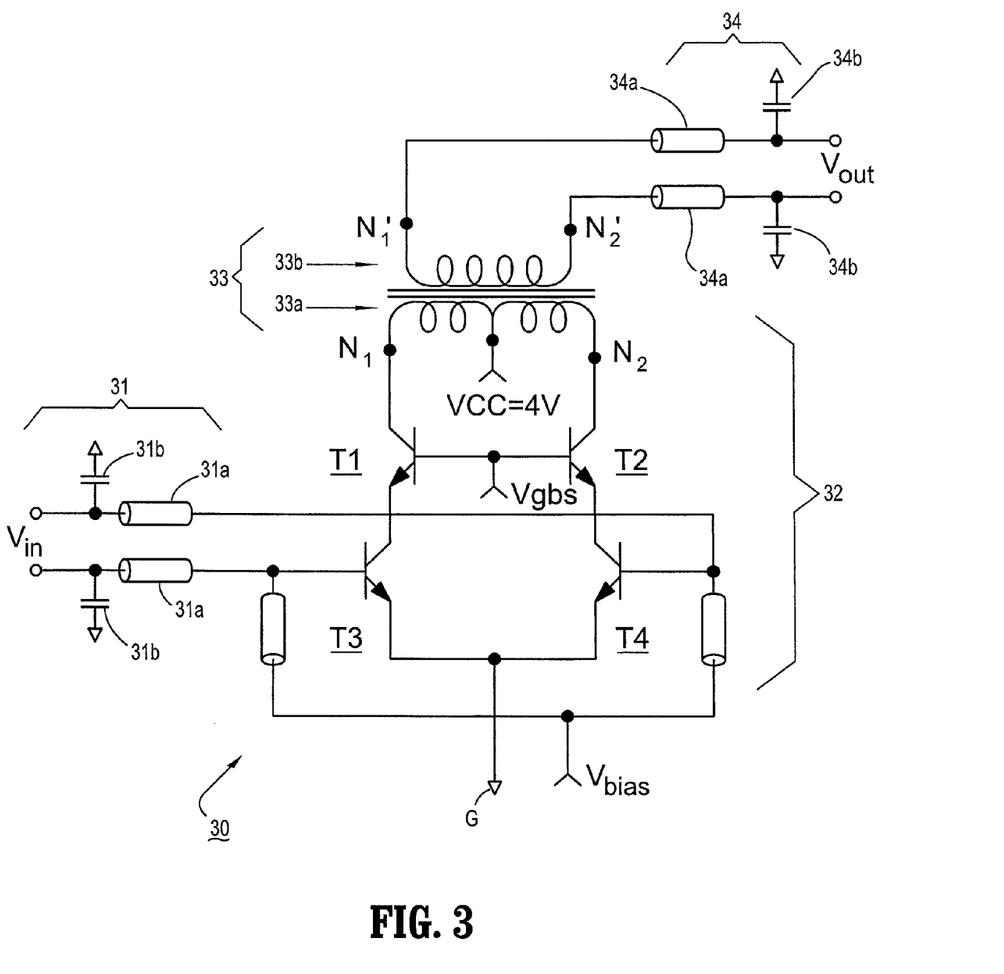
FIG. 3 is a schematic circuit diagram of an integrated transformer matched power amplifier circuit according to an exemplary embodiment of the invention.

FIG. 3 schematically illustrates an integrated circuit power amplifier which is constructed using an integrated circuit transformer device, according to an exemplary embodiment of the invention. More specifically, FIG. 3 depicts an exemplary integrated circuit power amplifier (30) for use with MMW applications, which implements an integrated circuit transformer (33) for high-efficient coupling of output power. In general, the power amplifier (30) comprises an input matching network (31) connected to the differential inputs of a cascode differential amplifier (32), an integrated transformer (33) connected to the differential output nodes of the differential amplifier (32) and an output matching network (34). The input matching circuit (31) matches the differential inputs, $V_{in}$, to a desired characteristic impedance (e.g., 50 Ohms) using series inductive microstrip lines (31a) and parallel capacitors (31b). The output matching circuit (34) matches the differential outputs, $V_{out}$, to a desired characteristic impedance (50 Ohms) using series inductive microstrip lines (34a) and parallel capacitors (34b).

The cascode differential amplifier (32) includes a first cascode stage comprising serially connected transistors T1 and T3, and a second cascode stage comprising serially connected transistors T2 and T4. The transistors T3 and T4 (common-emitter input stages) drive respective transistors T1 and T2 (common-base output stages). A bias Voltage, Vbias, is applied to the base terminals of transistors T3 and T4 and a constant DC voltage, Vgbs, is applied to the base terminals of transistors T1 and T2. These bias voltages are selected to prevent the base to collector voltage across each transistor T1~T4 from exceeding the breakdown voltage of the transistor in the cascode array and to divide the peak voltage applied between the collectors of T1 and T2 and emitters of respective transistors T3 and T4 to prevent breakdown.

In the exemplary embodiment of FIG. 3, the integrated circuit transformer (33) is schematically depicted as having a primary conductor (33a) with input terminals (nodes N1 and N2) and a secondary conductor (33b) with output terminals (nodes N1' and N2'). The collector terminals of transistors T1 and T2 are connected to nodes N1 and N2, respectively. In one exemplary embodiment, the integrated circuit transformer (33) comprises a 1:1 IC transformer having a framework as described in FIGS. 2A and 2B, wherein the primary conductor (33a) and secondary conductor (33b) are stacked over a slotted ground shield. In this embodiment, the collectors of transistors T1 and T2 (output nodes N1, N2) are connected to the length ends of the primary conductor (33a) of the integrated transformer (33), and bias voltage VCC connection is made to a center region between the length ends of the primary conductor (33a).

With the exemplary framework of FIG. 3, the 1:1 IC transformer (33) couples the differential output voltage (VN1-VN2) of the differential amplifier (32) to the secondary conductor (33b) at nodes N1' and N2'. The 1:1 IC transformer (33) is utilized as a resonator to provide high-efficient coupling of the output power of the amplifier. In another exemplary embodiment, a 1:1 IC transformer can be coupled to the input of the differential amplifier circuit.

Moreover, in the exemplary embodiment of FIG. 3, the input terminal, Vin, are driven differentially with equal amplitude, opposite phase, RF signals, which creates a virtual AC ground on the primary conductor (33a) at the point where the VCC supply connection is made, and at the ground G connection between the sources of the transistors T3 and T4. The virtual AC grounds are points of low loss and low impedance. As such, the virtual AC ground at the VCC connection point eliminates the need for a separate choke inductor and/or a large on-chip bypass capacitor at the VCC supply connection.

Figure 4:
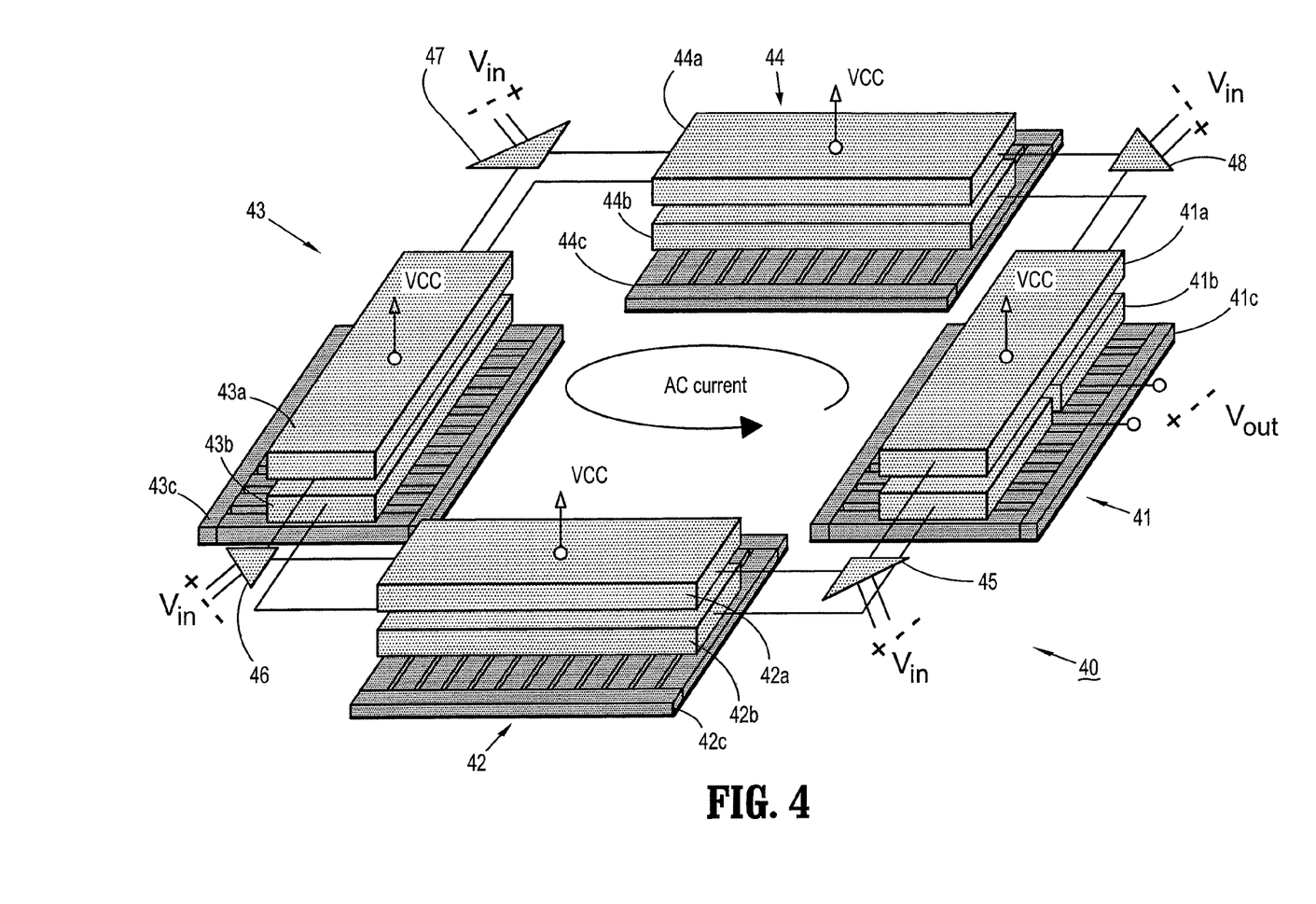
FIG. 4 is a schematic circuit diagram of an integrated power combiner circuit according to an exemplary embodiment of the invention.

It is to be appreciated that a plurality of 1:1 IC transformer devices can be used as templates or building blocks for constructing other IC component/devices for MMW applications. For example, FIG. 4 is a schematic circuit diagram illustrating an integrated power combiner circuit according to an exemplary embodiment of the invention. More specifically, FIG. 4 schematically illustrates a power combiner circuit (40) that is implemented using four transformer template devices (41, 42, 43 and 44), and a plurality of differential push-pull amplifiers (45, 46, 47 and 48), which are arranged in a square or circular geometry. Each transformer template device (41, 42, 43 and 44) is schematically depicted as having a primary conductor (41a, 42a, 43a and 44a), a secondary conductor (41b, 42b, 43b and 44b) and a slotted ground shield (41c, 42c, 43c and 44c), respectively, similar to the exemplary IC transformer framework of FIGS. 2A and 2B.

In the exemplary embodiment, the secondary conductors are connected in series and the secondary conductor (41b) of transformer (41) is separated at a mid section thereof to provide differential + − output terminals, Vout. Moreover, each primary conductor (41a, 42a, 43a, and 44a) is connected between differential outputs of adjacent power amplifiers and has a center point that is connected to VCC terminal to provide DC bias voltage to the amplifiers. The power combiner circuit (40) can be constructed using 4 push-pull amplifiers each with a 1:1 transformer (such as depicted in FIG. 3), whose secondary conductors are connected in series. With such exemplary embodiment, an input voltage, Vin, is divided into four equal amplitude, equal phase signals, which are simultaneously applied to different ones of + differential inputs of the amplifiers (45, 46, 47 and 48), and an inverted input voltage, Vin, is divided into four equal amplitude, equal phase signals, which are simultaneously applied to different ones of − differential inputs of the amplifiers (45, 46, 47 and 48), to thereby create an alternating current on each primary conductor. The AC currents on the primary conductors are coupled to the serially connected secondary conductors to generate combined output voltage, Vout. With the exemplary embodiment, since the primary conductors are independent, the distributed architecture provides a power combiner as well as a 4:1 impedance transformer. In other words, the exemplary power combiner (40) provides combining and impedance transformation for power amplifier applications.

Figure 5:
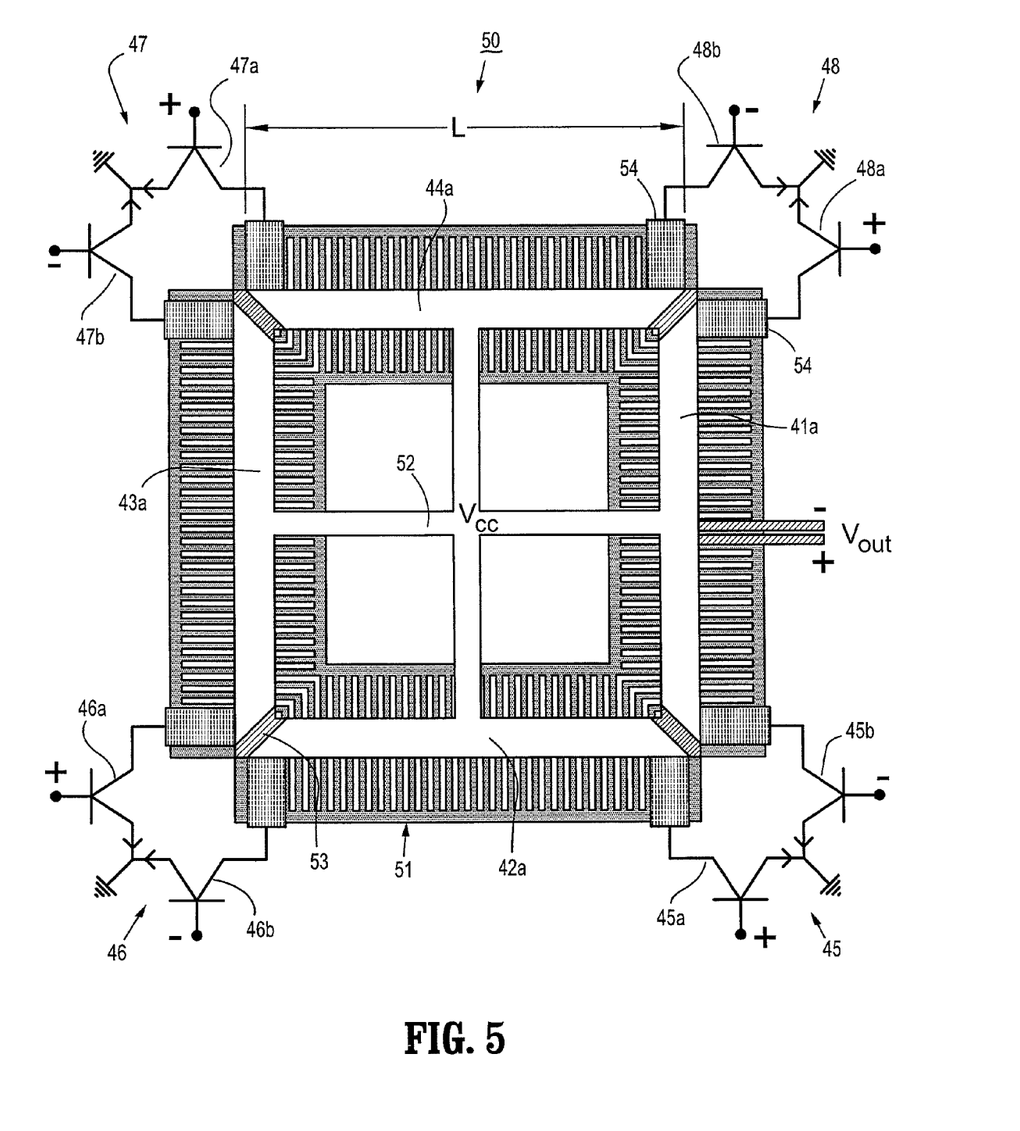
FIG. 5 is an exemplary schematic circuit layout of the integrated power combiner circuit of FIG. 4, according to an exemplary embodiment of the invention.

FIG. 5 schematically illustrates an exemplary circuit layout (50) of the power combiner circuit of FIG. 4, according to an exemplary embodiment of the invention. More specifically, FIG. 5 schematically illustrates an exemplary layout pattern (50) comprising a ground shield (51), bias voltage VCC network (52), a continuous secondary conductor (53), connectors (54) and exemplary embodiments for the push-pull amplifiers (45, 46, 47 and 48). The exemplary ground shield (51) pattern integrally combines each of the separate ground shields (42c, 43c, 44c and 45c) of the transformer template devices (42, 43, 44 and 45) depicted in FIG. 4. The ground shield (51) is patterned to form separate patterns of close-ended slots that extend orthogonally to the respective transformer conductors.

The distributed transformer framework comprises the continuous secondary conductor (53) having differential output terminals Vout, and separate primary conductors (41a, 42a, 43a, 44a) that are stacked over, and aligned to, different portions along the length of the secondary conductor (53). The DC supply voltage network (52) comprises a plurality of wires that connect to center portions of each of the primary conductors (41a, 42a, 43a, 44a).

FIG. 5 further depicts each of the push-pull amplifiers (45), (46), (47) and (48) implemented using respective pairs of common-emitter gain stages (45a/45b), (46a/46b), (47a/47b), (48a/48b) having BJT (bipolar junction transistors). It is to be understood that the differential push-pull amplifier frameworks depicted in FIG. 5 are merely exemplary, and that other differential push-pull amplifier designs, such as depicted in FIG. 3, may be implemented. Moreover, the amplifiers can be implemented using CMOS devices. Each primary conductor (41a, 42a, 43a, 44a) has angled length end portions that are connected to differential outputs of respective push-pull amplifiers via connectors (54).

In the exemplary embodiment, the differential amplifiers (45, 46, 47 and 48) are connected to the primary conductors (42a, 43a, 44a, 45a) such that each primary conductor (42a, 43a, 44a, 45a) has a corresponding push/pull amplifier pair, i.e., amplifier pair (48a/45b) for primary conductor (41a), amplifier pair (45a/46b) for primary conductor (42a), amplifier pair (46a/47b) for primary conductor (43a) and amplifier pair (47a/48b) for primary conductor (44a). The primary conductors provide low resistance paths for the dc current to flow from the DC supply to the drains of the transistors. The source terminals of adjacent transistors of adjacent amplifiers are connected together and share a common ground. As shown by the "+" and "−" symbols, each pair of adjacent transistors are driven in opposite phases.

A power distribution network (not shown) is used to apply synchronized differential power to the gates of the transistors. For example, in the exemplary embodiment of FIGS. 4 and 5, two sets of three Wilkinson power dividers can be implemented to divide both an input signal Vin and inverted input signal Nin into four equal phase, equal amplitude, input signals that are synchronously applied to the different inputs of amplifiers 45, 46, 47 and 48. The exemplary power combiner circuit in FIG. 5 achieves power combining by operating the push-pull amplifiers to conduct identical synchronized ac currents at the fundamental frequency on respective primary conductors, thereby inducing a corresponding ac current in the continuous secondary conductor. The secondary conductor (53) harnesses the induced AC power to generate a voltage at terminals Vout that is equal to the sum of the differential voltages of the 4 push-pull amplifiers.

In another exemplary embodiment of the invention, the circuits of FIGS. 4 and 5 can be extended to construct a power splitter. In such instance, the continuous secondary conductor in FIG. 5 would be the primary conductor that receives an input signal (at the Vout terminal) and each separate primary conductor in FIG. 5 would be the secondary conductors that each couple about ¼ of the EM energy of the primary. In this manner, a symmetrical 1:4 power splitter could be implemented.

It is to be appreciated that an integrated transformer device according to an exemplary embodiment of the invention can be accurately modeled using lumped equivalent elements to define models that are scalable by conductor length, Lc, and other possible geometric parameters of the integrated transformer. More specifically, the exemplary 1:1 transformer structure having a ground shield design with orthogonal slots and collinear side bars as described above with reference to FIGS. 2A and 2B, for example, enables compact modeling of the integrated transformer structure by providing closed environment EM conditions which relaxes the parasitic effects and boundary conditions. This provides the ability to define compact models of 1:1 transformer templates that are scalable by length independent of the proximity of other structures in the layout.

Currently, various applications are commercially available that can be used to build and simulate various types of 2D/3D integrated circuits, components and other structures for microwave and RF applications. These applications allow designers to build 3D/2D integrated circuit layouts with interconnects and apply full-wave 3D circuit EM simulators that determine the electrical properties and response of integrated circuit designs taking into account the effects of other transformers, wires, interconnects or other radiating structures, which provide undesirable impedances (parasitic capacitances and inductances) that, in practice, affect circuit performance. Some applications include methods for extracting a two port frequency dependent network representation of various circuit components using the 3D processing results and create a lumped equivalent circuit for such components. However, when the 3D circuit layout is modified, the lumped equivalent circuit no longer accurately defines the characteristics/properties of the modified 3D circuit, and a full 3D EM simulation must be performed again to extract relevant parameters to recreate the lumped equivalent circuits for circuit simulation using simple nodal analysis, for example.

It is to be appreciated, however, that an exemplary 1:1 transformer structure with a slotted ground shield design with side-bars allows the transformer structure analyzed in isolation using circuit simulation without having to perform a full wave 3D analysis to consider the effects of metal objects (on-chip transmission lines, inductors, bond pads, interconnects etc.) in proximity to the integrated transformer template. In this manner, compact models of a 1:1 transformer structure can be accurately defined with a lumped equivalent model which can be universally applied for circuit simulation. For example, the schematic power combiner circuit (40) can be accurately simulated using lumped equivalent models of a 1:1 transformer template structure according to an embodiment of the invention for each of the schematically depicted transformers (41, 42, 43 and 44), irrespective of the 3D configuration and circuit layout (e.g., FIG. 5). In this regard, the transformer models are decoupled from each other and other circuit components, allowing the circuit to be simulated using simple nodal analysis with lumped equivalent models. This is in contrast to conventional integrated circuit coupled line transformers (such as depicted in FIG. 1) which require 3D EM simulations for different layouts and circuit configurations in MMW applications.

In one exemplary embodiment described below, an integrated circuit 1:1 transformer device having a framework as depicted in FIGS. 2A and 2B can be modeled using a simple RLC filter network (including coupled inductors and dependent sources) for circuit simulation applications. A compact model of an integrated circuit transformer device can accurately describe the electrical properties/characteristics of the integrated circuit transformer in all modes of operation and all secondary/primary complex loads, and such properties up to third harmonic of a fundamental millimeter wave frequency. The lumped equivalent model can be used to readily determine network values by simple 2D EM simulations.

In one exemplary embodiment of the invention, a simulation model for the exemplary stacked 1:1 transformer template with slotted ground shield, which is scalable by length, can be built as follows. Initially, a 1:1 integrated circuit transformer template structure can be designed using a 3D circuit layout tool. Thereafter, 3D EM solver methods are applied to extract the parameters of the transformer structure per unit length. In particular, a 2×2 capacitance matrix can be computed for the two signal lines (primary and secondary conductors) above the ground plane (consisting of two collinear side bars and orthogonal conductive strips using a 3D static capacitance solver. The side-bar structures enable use of a 3D full wave emulation of the transformer template to extract the model under the assumption of closed EM environment. It is to be appreciated, however, that a 2D solver could be used as a good approximation when the pattern of orthogonal stripes is sufficiently dense (which is preferred to shield against silicon substrate losses). Moreover, a static solver is sufficient to determine the capacitance parameters, when the separation between the metals is negligible as compared with the wavelength.

Thereafter, a frequency dependent 2×2 inductance matrix and frequency dependent 2×2 resistance matrix is obtained using a 2D simulation of a reduced transformer structure which contains the two signal lines and a reduced ground plane containing only the two collinear side bars (return path lines) without the orthogonal stripes. Analysis using the reduced structure is justified since the Z element of the model describes only the distribution of the longitudinal currents. The minimal bandwidth required for these EM simulations is from the fundamental MMW frequency up to the third harmonics. A full solution for the skin and proximity effects is performed due to the millimeter wave frequencies.

Then, using the EM solver data, an RLC network is constructed for two coupled lines above a ground plane. The RLC network comprises an appropriate filter network (ladder circuit) which describes the frequency dependence of the resistance and inductance matrix in the given bandwidth. In addition to the RLC passive elements, and the mutual inductance coupling elements between the inductors, dependent sources are also included to correctly describe the frequency dependence in both the even and odd modes. These dependent sources are connected in a manner which assures the model passivity (unconditional stability). Several of such RLC segments are used for achieving a distributed model (e.g., at least 10 segments are used per wavelength).

Accordingly, exemplary model building methods described above can be used to define lumped equivalent models for 1:1 integrated transformer template devices which are scalable by length (or other geometric parameters) and which can be universally applied for circuit design and simulation. Indeed, various compact models for transformer template devices can be defined, for structures having different geometric parameters such as slot distances, slot widths, conductor widths and thicknesses, for example, and for structures that are formed using different semiconductor fabrication technologies, for example.

Figure 6:
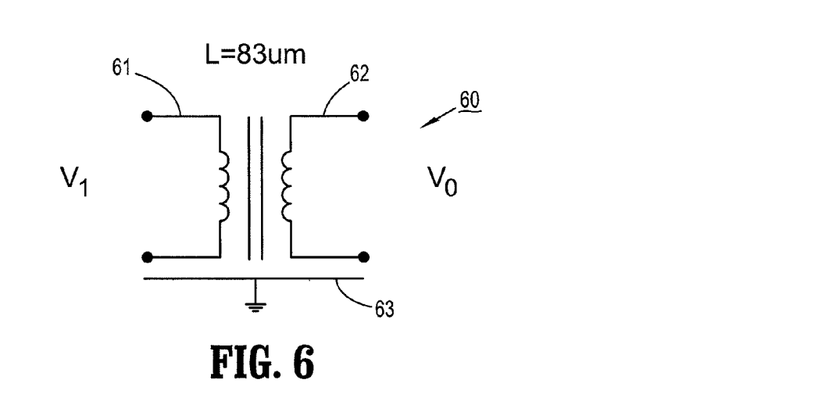
FIG. 6 is an exemplary component icon that represents a lumped equivalent model of an integrated circuit transformer device that is scalable by length, according to an exemplary embodiment of the invention.

With such methods, one or more transformer models can be included as part of a design kit or library of models in circuit simulation application to enable design and simulation of integrated circuits for MMW application which implement exemplary transformer template devices according to the invention. The models can be built allowing parameterization with user-defined parameters (e.g., conductor length, etc.) can be specified for simulations. FIG. 6 depicts an exemplary ICON representation for a 1:1 transformer template model that can be used in a simulation application. The icon of FIG. 6 is a schematic depiction of a transformer (60) having a primary conductor (61) and secondary conductor (62) over a ground plane (63), for a 1:1 transformer template model that allows values for the conductor length L in um to be user-defined.

Figure 7:
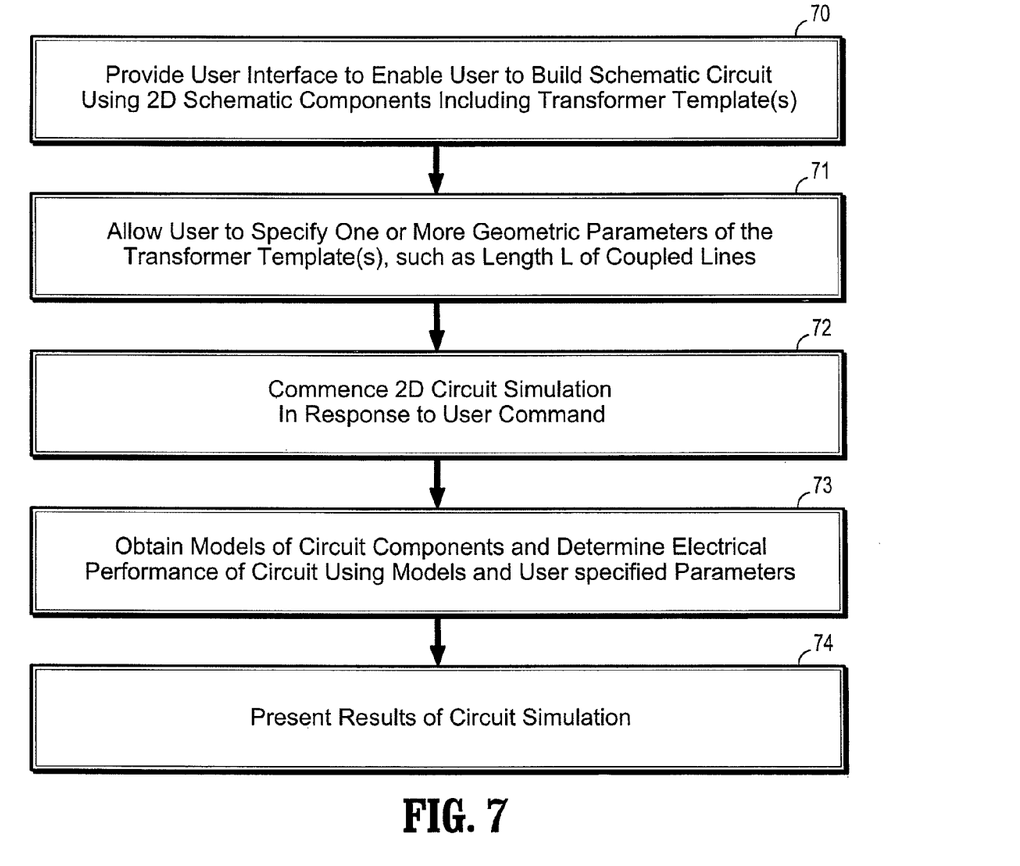
FIG. 7 is a flow diagram of a method for performing circuit simulation using an integrated circuit transformer model that is scalable by length or other user specified parameters, according to an exemplary embodiment of the invention.

FIG. 7 is a flow diagram of a method for performing circuit simulation using a lumped equivalent model of an integrated circuit transformer that is scalable by length or other user specified parameters, according to an exemplary embodiment of the invention. The method of FIG. 7 can be implemented in any suitable 3D/2D design and simulation application having user interface that enables a user to build schematic circuits, for example. Referring to FIG. 7, a user can build schematic circuit using device/component icons such as the transformer template icon of FIG. 6 (step 70). In such instance, the application would have a library of models for each of the components. As noted above, according to one exemplary embodiment of the invention, the user would be able to select one or more types of transformer template models (which are provided as part of the library), in which one or more geometric parameters, such as length, would be a variable defined by the user (step 71). Depending on the model design, other geometric parameters such as slab width, etc. could be variables input by the user.

After the schematic circuit is created, the user could perform a circuit simulation by specifying values for one or more parameters (e.g., voltages, frequency ranges, device values, etc.) of lumped equivalent models that enable input of user-specified parameters, and then executing the appropriated commands to obtain the desired electrical response/characteristics of the circuit based on the user specified parameters (step 72). The circuit simulation is performed by performing a nodal analysis of the given circuit using the lumped models for the constituent circuit components/devices as parameterized by the user-specified parameters (step 73). Thereafter, the results of the circuit simulation would be presented to the user for review (step 74).

It is to be appreciated that the exemplary model building and circuit simulation methods described above are merely exemplary. In one embodiment, a circuit design and simulation tool can include a library of one or more predefined transformer template device models with scalable parameters, which can be used for circuit analysis. In other exemplary embodiments of the invention, 2D/3D circuit design and simulation tools can be extended to include the transformer template model building methods described above, which allow a user to create custom, user-defined compact transformer models by generating custom transformer template structures, and then apply relevant model building method to extract the 2D/3D EM parameters needed to construct a corresponding lumped equivalent model. In other embodiments, 2D/3D tools can be implemented with both library of pre-defined transformer template models, and the tools needed for generating custom transformer template models.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A computer implemented method for integrated circuit design and simulation, comprising:
generating a virtual model of a circuit using a model for each component of the circuit, wherein at least one model comprises a lumped equivalent circuit representation of an integrated circuit transformer structure having stacked primary and secondary conductors over a ground planewith, in which conductor length is a user-specified parameter;
performing a simulation of the circuit based on one or more user-specified parameter values for conductor length; and
presenting results of the simulation.

2. The computer implemented method of claim 1, wherein the lumped equivalent circuit representation of the integrated transformer comprises an RLC filter network.

3. The computer implemented method of claim 1, wherein generating a virtual model comprises:
providing a user interface that allows a user to build a schematic depiction of the circuit using schematic icon depictions of the circuit components; and
obtaining a model corresponding to each schematic icon depiction from a library of predefined models.

4. The computer implemented method of claim 1, wherein generating a virtual model comprises:
providing a user interface that allows a user to build a 3D circuit layout representation of the circuit;
performing a 3D EM analysis of the 3D circuit; and
generating an equivalent model for each circuit component using results of the 3D EM analysis.

5. A computer implemented method for integrated circuit design and simulation, comprising:
- generating a virtual model of a circuit using a model for each component of the circuit, wherein at least one model comprises a lumped equivalent circuit representation of an integrated circuit transformer structure having:
  - a substrate having a substrate surface in a lateral plane;
  - a ground shield formed on the substrate surface;
  - a primary conductor comprising an elongated conductive strip having a longitudinal axis extending in a first direction; and
  - a secondary conductor comprising an elongated conductive strip having a longitudinal axis extending in the first direction,
  - wherein the primary conductor and the secondary conductor lie in respective different planes substantially parallel to the lateral plane and are aligned with one another and to form a coupled-wire structure that is disposed adjacent to the ground shield, and
  - wherein the ground shield comprises a pattern of close-ended parallel elongated slots, wherein a longitudinal axis of each of the elongated slots of the ground shield extends in a second direction that is orthogonal to the first direction, and wherein the ground shield comprises edge regions that provide current return paths that are collinear to the first direction, wherein the edge regions are disposed adjacent to ends of the close-ended parallel elongated slots;
- performing a simulation of the circuit based on one or more user-specified parameter values for conductor length; and
- presenting results of the simulation.

6. The computer implemented method of claim 5, wherein the lumped equivalent circuit representation of the integrated transformer comprises an RLC filter network.

7. The computer implemented method of claim 5, wherein generating a virtual model comprises:
- providing a user interface that allows a user to build a schematic depiction of the circuit using schematic icon depictions of the circuit components; and
- obtaining a model corresponding to each schematic icon depiction from a library of predefined models.

8. The computer implemented method of claim 5, wherein generating a virtual model comprises:
- providing a user interface that allows a user to build a 3D circuit layout representation of the circuit;
- performing a 3D EM analysis of the 3D circuit; and
- generating an equivalent model for each circuit component using results of the 3D EM analysis.

* * * * *